United States Patent
Kang et al.

(10) Patent No.: US 10,217,928 B2
(45) Date of Patent: Feb. 26, 2019

(54) CURVED PIEZOELECTRIC DEVICE

(71) Applicant: Korea Institute of Science and Technology, Seoul (KR)

(72) Inventors: Chong Yun Kang, Seoul (KR); Seok Jin Yoon, Seoul (KR); Jin Sang Kim, Seoul (KR); Ji-Won Choi, Seoul (KR); Seung Hyub Baek, Seoul (KR); Seong Keun Kim, Seoul (KR); Woo-Suk Jung, Seoul (KR); Beomjin Kwon, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 428 days.

(21) Appl. No.: 15/158,158

(22) Filed: May 18, 2016

(65) Prior Publication Data
US 2016/0365501 A1    Dec. 15, 2016

(30) Foreign Application Priority Data
Jun. 10, 2015  (KR) .......................... 10-2015-0081799

(51) Int. Cl.
*H01L 41/02*    (2006.01)
*H01L 41/113*    (2006.01)

(52) U.S. Cl.
CPC ................... *H01L 41/113* (2013.01)

(58) Field of Classification Search
CPC .................................................. H01L 41/113
(Continued)

(56) References Cited

U.S. PATENT DOCUMENTS 4,088,915 A * 5/1978 Kodama ............ H04R 17/005
                                                310/334
5,471,721 A * 12/1995 Haertling ............ H01L 41/29
                                                29/25.35
(Continued)

FOREIGN PATENT DOCUMENTS

JP    2009-273339 A    11/2009
KR    10-2003-0043417 A    6/2003
(Continued)

OTHER PUBLICATIONS

Mutsuda, Hidemi, et al. "Wind Energy Harvesting Using Flexible Piezoelectric Device." Journal of Energy and Power Engineering, vol. 7, 2013 (1047-1051).

*Primary Examiner* — Thomas M Dougherty
(74) *Attorney, Agent, or Firm* — NSIP Law

(57) ABSTRACT

Disclosed is a curved piezoelectric device maximizing an electrical potential of the piezoelectric material corresponding to an external mechanical stress. The curved piezoelectric device includes: a curved substrate; and a piezoelectric material provided on one surface or both surfaces of the curved substrate, wherein when a stress is applied, a neutral plane in which a compressive stress and a tensile stress are balanced is located in the curved substrate, wherein the location of the neutral plane is determined by $y_1$ and $y_2$ of Equation 1 or 2 below, and wherein the location of the neutral plane is controllable by adjusting a thickness (d), a sectional area (A) and a Young's modulus (E) of each of the curved substrate and the piezoelectric material: wherein $$y_1 = \frac{E_2 d_2 (d_1 + d_2)}{2(E_1 d_1 + E_2 d_2)}, y_2 = \frac{E_1 d_1 (d_1 + d_2)}{2(E_1 d_1 + E_2 d_2)} \text{ and} \quad \text{Equation 1}$$

(Continued)

-continued $$y_1 = \frac{E_2 A_2 (A_1 + A_2)}{2(E_1 A_1 + E_2 A_2)}, \quad y_2 = \frac{E_1 A_1 (A_1 + A_2)}{2(E_1 A_1 + E_2 A_2)}.$$  Equation 2

10 Claims, 15 Drawing Sheets

(58) Field of Classification Search
USPC .................................. 310/367, 368, 371, 337
See application file for complete search history.

(56) References Cited

U.S. PATENT DOCUMENTS

| | | | | |
|---|---|---|---|---|
| 5,632,841 | A * | 5/1997 | Hellbaum | B32B 37/144 156/160 |
| 6,189,858 | B1 * | 2/2001 | Miyazoe | F16K 15/185 251/129.06 |
| 7,281,304 | B2 | 10/2007 | Kim et al. | |
| 8,803,406 | B2 | 8/2014 | Lee et al. | |
| 2004/0070314 | A1 * | 4/2004 | Yoon | H01L 41/0926 310/330 |
| 2009/0026892 | A1 * | 1/2009 | Nakamura | H01L 41/094 310/367 |
| 2010/0045141 | A1 * | 2/2010 | Pulskamp | H01L 41/0933 310/328 |
| 2015/0285962 | A1 * | 10/2015 | Phair | G02B 3/14 29/25.35 |

FOREIGN PATENT DOCUMENTS

| | | |
|---|---|---|
| KR | 10-2005-0048751 A | 5/2005 |
| KR | 10-0599083 B1 | 7/2006 |
| KR | 10-2009-0082527 A | 7/2009 |
| KR | 10-2009-0082841 A | 7/2009 |
| KR | 10-2010-0009266 A | 1/2010 |
| KR | 10-1380538 B1 | 4/2014 |
| WO | WO 03/047008 A1 | 6/2003 |
| WO | WO 2010/008133 A1 | 1/2010 |

* cited by examiner

CURVED PIEZOELECTRIC DEVICE

CROSS-REFERENCE TO RELATED APPLICATION

This application claims priority to Korean Patent Application No. 10-2015-0081799, filed on Jun. 10, 2015, and all the benefits accruing therefrom under 35 U.S.C. § 119, the contents of which in its entirety are herein incorporated by reference.

BACKGROUND

1. Field

The present disclosure relates to a curved piezoelectric device, and more particularly, to a curved piezoelectric device having a piezoelectric material on one surface or both surfaces of a curved substrate, where a thickness, a sectional area and a Young's modulus of the curved substrate and the piezoelectric material are controlled to locate a neutral plane in the curved substrate, thereby maximizing an electrical potential of the piezoelectric material corresponding to an external mechanical stress.

[Description about National Research and Development Support]

This study was supported by the Energy Technology R&D Project of Ministry Of Trade, Industry & Energy, Republic of Korea (Development and demonstration of Piezoelectric Energy Harvester for using unused energy in road traffic, Project No. 20142020103970) under the Industrial-Academic Cooperation Group of Hanyang University.

2. Description of the Related Art

Recently, as electronic devices become smaller, a technique capable of substituting for a battery in an electronic device is being actively studied. One of representative ways for substituting for a battery is using a piezoelectric element. In other words, a piezoelectric element may be disposed in an electronic device, mechanical energy such as pressure, vibration or the like may be converted into electric energy by means of the piezoelectric element, and the electric energy generated by the piezoelectric element may be used as a power source of the electronic device.

The piezoelectric element may be classified into a bulk type, a cantilever type, a flexible type or the like, depending on its shape and the kind of piezoelectric material. In a bulk type, a mechanical force is applied to a bulk type piezoelectric material to generate electric energy. In a cantilever type, a piezoelectric material is attached to one side of a cantilever type support to generate electric energy according to deformation of the support. In a flexible type, a mechanical force is applied to a flexible piezoelectric material to generate electric energy. Korean Patent Registration No. 10-599083 discloses an example of the cantilever type piezoelectric element.

In an existing piezoelectric element as described above, a bulk type piezoelectric element may not easily apply a great strain due to weak brittleness, and a cantilever type piezoelectric element may not be easily applied to a small electronic device due to a large volume since it demands additional structures such as a holder, a stopper or the like. In addition, a flexible type piezoelectric element using a flexible piezoelectric material has a very small output energy obtained by applying a mechanical force.

RELATED LITERATURES

Patent Literature (Patent Literature 1) Korean Patent Registration No. 10-599083

Non-Patent Literature (Non-patent Literature 1) Wind Energy Harvesting Using Flexible Piezoelectric Device, H. Mutsuda, et al., Journal of energy and power engineering, 7, pp. 1047-1051 (2013).

SUMMARY

The present disclosure is directed to providing a curved piezoelectric device having a piezoelectric material on one surface or both surfaces of a curved substrate, where a thickness, a sectional area and a Young's modulus of the curved substrate and the piezoelectric material are controlled to locate a neutral plane in the curved substrate, thereby maximizing an electrical potential of the piezoelectric material corresponding to an external mechanical stress.

In one aspect, there is provided a curved piezoelectric device, comprising: a curved substrate; and a piezoelectric material provided on one surface or both surfaces of the curved substrate, wherein when a stress is applied, a neutral plane in which a compressive stress and a tensile stress are balanced is located in the curved substrate, wherein the location of the neutral plane is determined by $y_1$ and $y_2$ of Equation 1 or 2 below, and wherein the location of the neutral plane is controllable by adjusting a thickness (d), a sectional area (A) and a Young's modulus (E) of each of the curved substrate and the piezoelectric material:

$$y_1 = \frac{E_2 d_2 (d_1 + d_2)}{2(E_1 d_1 + E_2 d_2)}, y_2 = \frac{E_1 d_1 (d_1 + d_2)}{2(E_1 d_1 + E_2 d_2)} \text{ where} \quad \text{Equation 1}$$

$$y_2 > \frac{d_2}{d},$$

$y_1$ is a distance between a center line of the curved substrate and the neutral plane, $y_2$ is a distance between a center line of the piezoelectric material and the neutral plane, $d_1$ is a thickness of the curved substrate, $d_2$ is a thickness of the piezoelectric material, $E_1$ is a Young's modulus of the curved substrate, and $E_2$ is a Young's modulus of the piezoelectric material, $$y_1 = \frac{E_2 A_2 (A_1 + A_2)}{2(E_1 A_1 + E_2 A_2)}, y_2 = \frac{E_1 A_1 (A_1 + A_2)}{2(E_1 A_1 + E_2 A_2)} \text{ where} \quad \text{Equation 2}$$

$$y_2 > \frac{d_2}{2},$$

$y_1$ is a distance between a center line of the curved substrate and the neutral plane, $y_2$ is a distance between a center line of the piezoelectric material and the neutral plane, $d_1$ is a thickness of the curved substrate, $d_2$ is a thickness of the piezoelectric material, $E_1$ is a Young's modulus of the curved substrate, $E_2$ is a Young's modulus of the piezoelectric material, $A_1$ is a sectional area of the curved substrate, and $A_2$ is a sectional area of the piezoelectric material.

The piezoelectric material provided on one surface or both surfaces of the curved substrate may be configured in multiple layers. In addition, the curved substrate may be made of a material allowing restoration by elasticity, and may be configured with a substrate made of polymer material or a substrate made of steel material with elasticity. In addition, the piezoelectric material may be any one of polymer-based piezoelectric material and inorganic piezoelectric material, or a composite material thereof.

The curved piezoelectric device according to the present disclosure gives the following effects.

By configuring the curved piezoelectric device to have a piezoelectric material on one surface or both surfaces of a curved substrate, providing a neutral plane in the curved substrate and selectively controlling a location of the neutral plane, an electrical potential of the piezoelectric material may be maximized.

DETAILED DESCRIPTION

Figure 1:
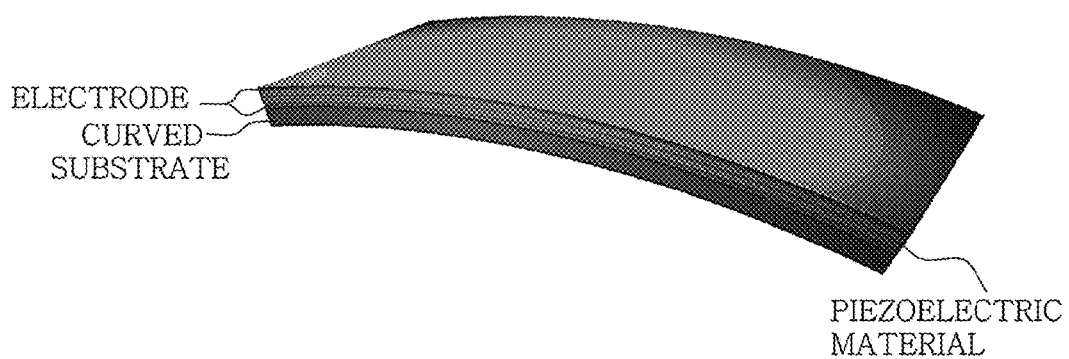
FIGS. 1 and 2 show a curved piezoelectric device according to an embodiment of the present disclosure.
Figure 2:
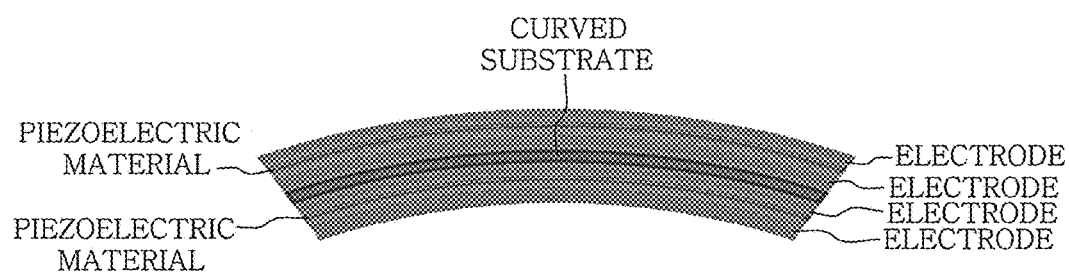

The present disclosure proposes a piezoelectric device capable of maximizing an electrical potential of a piezoelectric material. For this, the present disclosure proposes a structure in which the piezoelectric material is provided on one surface or both surfaces of a curved substrate. In case of a planar substrate, if an external stress is applied, the applied stress is distributed to the entire substrate. However, in case of a curved substrate, if an external stress is applied, the stress is concentrated on a center portion of the curved substrate. Therefore, a relatively greater external stress may be applied to the curved substrate in comparison to a planar substrate, and thus it is expected that the electrical potential of the piezoelectric material increases. FIG. 1 shows a structure in which a piezoelectric material is provided on one surface of a curved substrate, and FIG. 2 shows a structure in which a piezoelectric material is provided on both surfaces of the curved substrate.

As a method for maximizing an electrical potential of the piezoelectric material, in addition to applying the curved substrate, the present disclosure proposes a technique of controlling a neutral plane to be located in the curved substrate. The neutral plane means a point at which a compressive stress and a tensile stress have the same intensity when an external stress is applied. In a structure where the piezoelectric material is provided on one surface of the curved substrate, if the neutral plane is located in the piezoelectric material, when an external stress is applied, a compressive stress and a tensile stress simultaneously work to the piezoelectric material. If both the compressive stress and the tensile stress work in the piezoelectric material, the electrical potential is offset. Since an electrical potential formed by the compressive stress and an electrical potential formed by the tensile stress have opposite polarities, if both the compressive stress and the tensile stress work in the piezoelectric material, only a difference of absolute values of both electrical potentials becomes a final electrical potential of the piezoelectric material. Meanwhile, if the neutral plane is located in the curved substrate, when an external stress is applied, only one of the compressive stress and the tensile stress works in the piezoelectric material. Since only one of the compressive stress and the tensile stress works when an external stress is applied, both stresses are not offset, and thus the electrical potential of the piezoelectric material may be maximized.

In order to locate the neutral plane in the curved substrate, a thickness (d), a sectional area (A) and a Young's modulus (E) of each of the curved substrate and the piezoelectric material should be put into consideration, and equations described below should also be satisfied.

Conditions for locating the neutral plane in the curved substrate are as follows.

Figure 3:
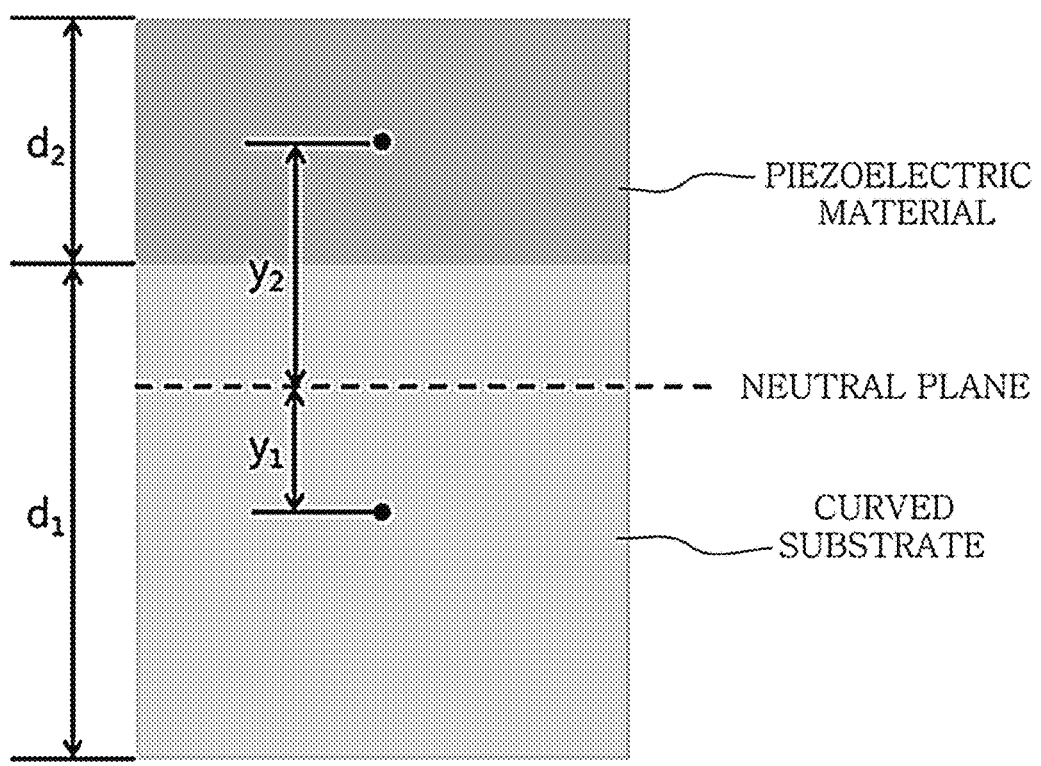
FIG. 3 is a reference view for illustrating a location of a neutral plane.

In a state where a thickness ($d_2$) of the piezoelectric material and a thickness ($d_1$) of the curved substrate are set, if a distance between a center line of the piezoelectric material and the neutral plane is $y_2$ and a distance between a center line of the curved substrate and the neutral plane is $y_1$ (see FIG. 3), relationships among $d_1$, $d_2$, $y_1$, $y_2$ may be defined as in Equation 1 below.

In addition, correlations among the thickness (d), the sectional area (A) and the Young's modulus (E) of each of the piezoelectric material and the curved substrate are defined by Equations 2 and 3 below. Equation 2 represents correlations among the thickness (d) and the Young's modulus (E) of each of the piezoelectric material and the curved substrate, and Equation 3 represents correlations among the sectional area (A) and the Young's modulus (E) of each of the piezoelectric material and the curved substrate. In addition to the above, in order to locate the neutral plane in the curved substrate, the distance ($y_2$) between the center line of the piezoelectric material and the neutral plane should be greater than a half ($d_2/2$) of the thickness of the piezoelectric material (see Equation 4).

By using simultaneous equations using Equations 1 and 2 or Equations 1 and 3, $y_1$ and $y_2$ may be obtained. If $y_1$ and $y_2$ are determined, a location of the neutral plane may be checked. Equation 5 below shows $y_1$ and $y_2$ obtained through the simultaneous equations using Equations 1 and 2, and Equation 6 below shows $y_1$ and $y_2$ obtained through the simultaneous equations using Equations 1 and 3.

The fact that $y_1$ and $y_2$ can be obtained through the simultaneous equations using Equations 1 and 2 or Equations 1 and 3 means that a location of the neutral plane can be controlled by adjusting the thickness (d), the sectional area (A) and the Young's modulus (E) of each of the piezoelectric material and the curved substrate. In addition, the intensity of a compressive stress or a tensile stress applied to the piezoelectric material varies depending on the location of the neutral plane, and the intensity of a compressive stress or a tensile stress applied to the piezoelectric material can be controlled by adjusting the thickness (d), the sectional area (A) and the Young's modulus (E) of each of the piezoelectric material and the curved substrate, which eventually means that the electrical potential of the piezoelectric material is controllable.

$$y_1 + y_2 = \frac{d_1 + d_2}{2} \quad \text{Equation 1}$$

($y_1$ is a distance between a center line of the curved substrate and the neutral plane, $y_2$ is a distance between a center line of the piezoelectric material and the neutral plane, $d_1$ is a thickness of the curved substrate, and $d_2$ is a thickness of the piezoelectric material.)

$$E_1 y_1 d_1 - E_2 y_2 d_2 = 0 \quad \text{Equation 2}$$

($E_1$ is a Young's modulus of the curved substrate, and $E_2$ is a Young's modulus of the piezoelectric material.)

$$E_1 y_1 A_1 - E_2 y_2 A_2 = 0 \quad \text{Equation 3}$$

($A_1$ is a sectional area of the curved substrate, and $A_2$ is a sectional area of the piezoelectric material.)

$$y_2 > \frac{d_2}{2} \quad \text{Equation 4}$$

$$y_1 = \frac{E_2 d_2 (d_1 + d_2)}{2(E_1 d_1 + E_2 d_2)} \quad \text{Equation 5}$$
$$y_2 = \frac{E_1 d_1 (d_1 + d_2)}{2(E_1 d_1 + E_2 d_2)}$$

$$y_1 = \frac{E_2 A_2 (A_1 + A_2)}{2(E_1 A_1 + E_2 A_2)} \quad \text{Equation 6}$$
$$y_2 = \frac{E_1 A_1 (A_1 + A_2)}{2(E_1 A_1 + E_2 A_2)}$$

If the above is arranged, in a structure where a piezoelectric material is provided on one surface or both surfaces of the curved substrate, if a neutral plane representing a point where a compressive stress and a tensile stress have the same intensity is located in the curved substrate, when an external stress is applied, only one of the compressive stress and the tensile stress is applied to the piezoelectric material, thereby maximizing an electrical potential of the piezoelectric material. In addition, the location of the neutral plane may be controlled by adjusting the thickness (d), the sectional area (A) and the Young's modulus (E) of each of the piezoelectric material and the curved substrate on the basis of Equation 5 or Equation 6 above.

Figure 9A:
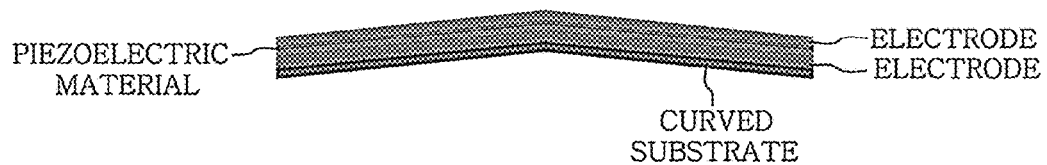
FIGS. 9A and 9B are reference views showing a curved piezoelectric device according to another embodiment of the present disclosure.
Figure 9B:
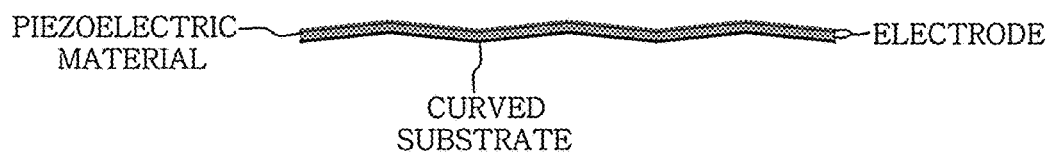

FIGS. 1 and 2 show a curved piezoelectric device according to an embodiment of the present disclosure, where FIG. 1 shows a structure in which a piezoelectric material is provided on one surface of a curved substrate, and FIG. 2 shows a structure in which a piezoelectric material is provided on both surfaces of the curved substrate. Though not shown in the figures, the piezoelectric material provided on one surface or both surfaces of the curved substrate is laminated repeatedly into multiple layers. In addition, the piezoelectric material may also be provided on a curved substrate as shown in FIGS. 9A and 9B.

In FIGS. 1 and 2, electrodes for transmitting an electrical potential generated by the piezoelectric material to the outside are provided on both surfaces of the piezoelectric material. A curved substrate employed in the curved piezoelectric device according to the present disclosure should have greater mechanical strength than the piezoelectric material and also have elasticity to be restored to an initial state. As the curved substrate, a substrate made of polymer material such as polyimide (PI) and poly(ethylene terephthalate) (PET) or a substrate made of steel material with excellent elasticity may be used. In addition, as the piezoelectric material, a polymer-based piezoelectric material such as poly(vinylidene fluoride) or an inorganic piezoelectric material such as PZT and ZnO may be used, and composite materials of the polymer-based piezoelectric material and the inorganic piezoelectric material may also be applied as the piezoelectric material of the present disclosure.

Figure 4A:
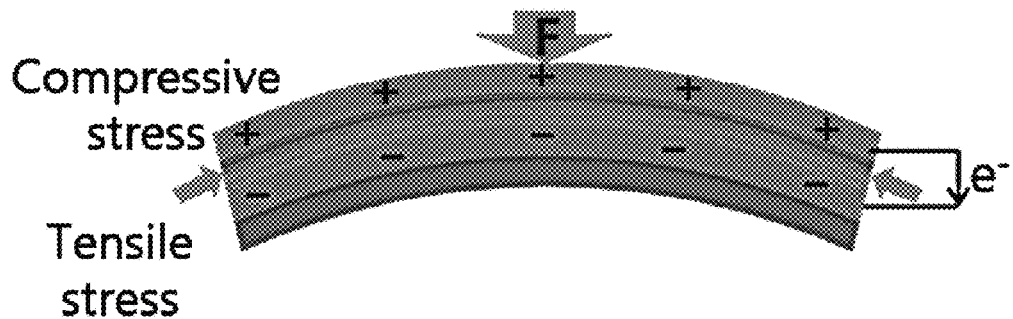
FIGS. 4A-4D are reference views for illustrating a process of generating an electrical potential by applying a stress to the curved piezoelectric device according to an embodiment of the present disclosure.
Figure 4B:
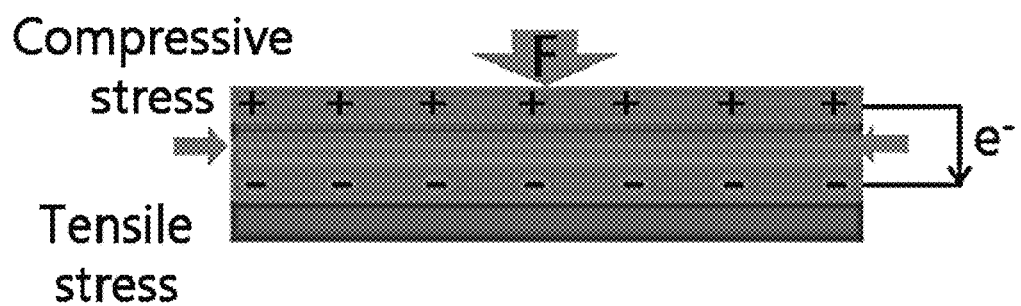
Figure 4C:
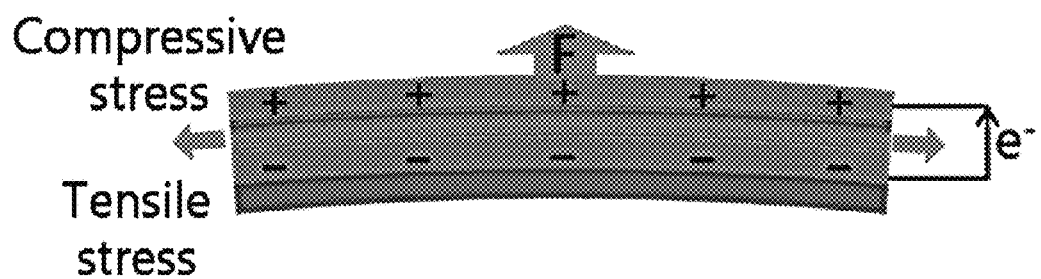
Figure 4D:
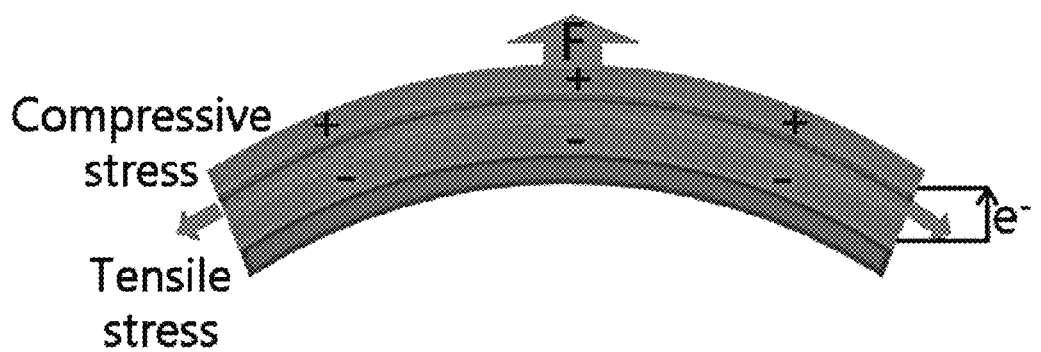

A process of generating an electrical potential by the curved piezoelectric device according to an embodiment of the present disclosure will be described below with reference to the drawings. FIGS. 4A-4D are reference views for illustrating a process of generating an electrical potential by applying a stress to the curved piezoelectric device according to an embodiment of the present disclosure. FIG. 4A shows an initial state where a stress is not applied, FIG. 4B shows a state where the curved substrate is deformed into a planar shape by applying a stress thereto, FIG. 4C shows that the curved substrate is being restored to an initial state by removing the stress, and FIG. 4D shows a state where the curved substrate is completely restored to an initial state due to the removal of the stress. In addition, the curved piezoelectric device of FIGS. 4A-4D is on the assumption that the neutral plane is present in the substrate.

Referring to FIGS. 4A-4D, if an external stress is applied, since the neutral plane is present in the curved substrate, only a compressive stress is applied to the piezoelectric material (see the FIG. 4A), the compressive stress applied to the piezoelectric material becomes maximum in the FIG. 4B, and the electrical potential of the piezoelectric material according to the compressive stress also represents a maximum value. Subsequently, if the external stress is removed, due to the elasticity of the curved substrate, the curved substrate is restored into an initial state. Here, while the curved substrate is being restored into an initial state, a tensile stress is applied to the piezoelectric material, and thus in FIG. 4D, the tensile stress becomes maximum and also the electrical potential of the piezoelectric material according to the tensile stress represents a maximum value.

Next, the present disclosure will be described in more detail on the basis of an experimental example.

Figure 5A:
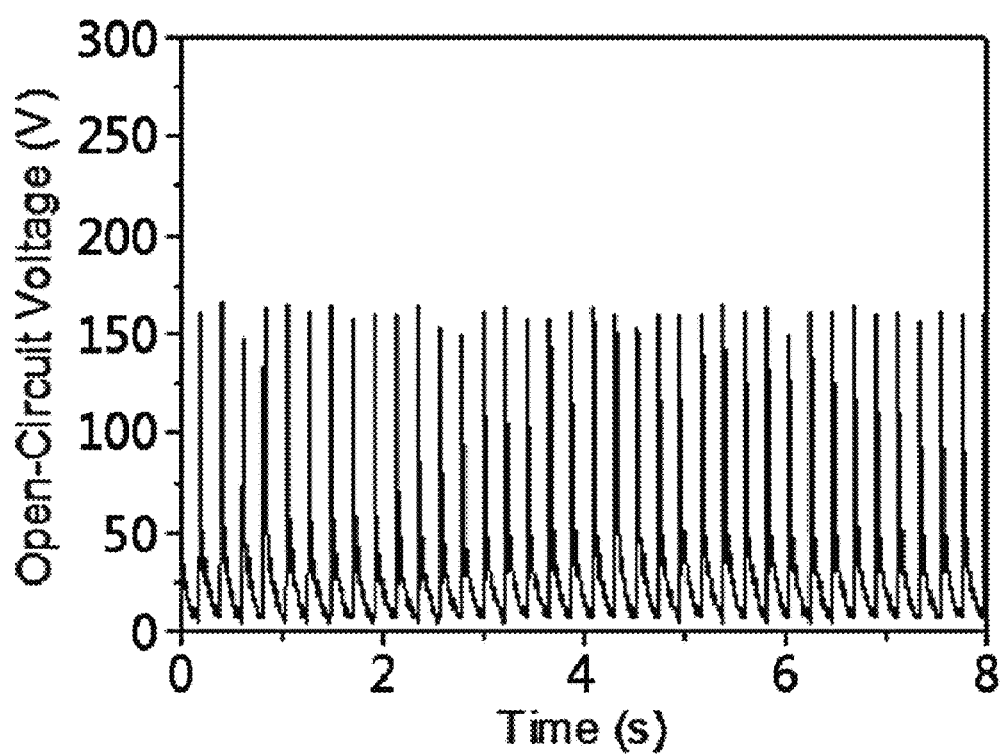
FIGS. 5A and 5B show output voltage and output current characteristics of the curved piezoelectric device according to an embodiment of the present disclosure, according to an external stress.
Figure 5B:
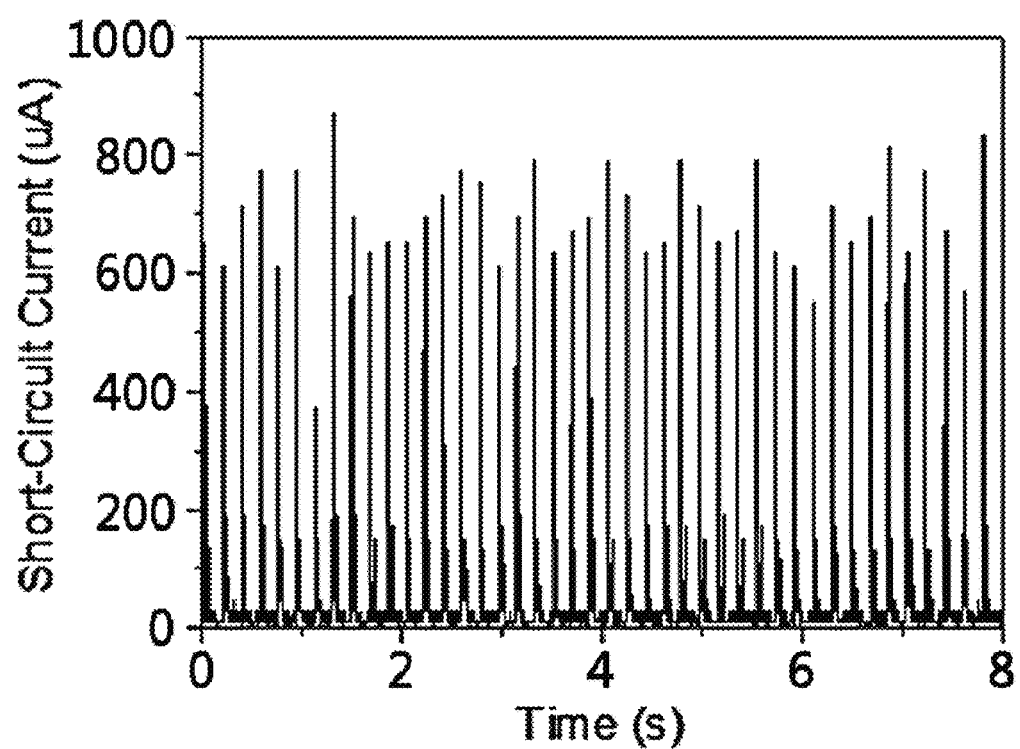

FIGS. 5A and 5B show output voltage and output current characteristics of the curved piezoelectric device according to an embodiment of the present disclosure, according to an external stress. In FIGS. 5A and 5B, the curved piezoelectric device is prepared by attaching polyvinylidene difluoride (PVDF) having a thickness of 0.1 mm onto a PI film having a thickness of 0.2 mm, and gold (Au) having a thickness of 200 nm is deposited on both surfaces of the PVDF in advance by using an electron beam evaporator. The prepared curved piezoelectric device had an area of 7×4 $cm^2$ and a thickness of 0.6 mm. A force is applied to the prepared curved piezoelectric device using a finger (~3.9 $mW/cm^2$), and then as shown in FIGS. 5A and 5B, it is checked that a voltage of ~155 V and a current of ~700 µA (with a current density of ~25 µA/cm²) are generated. The output voltage and the output current as found above exhibit excellent electric characteristics in comparison to a common flexible piezoelectric energy generator using PVDF.

Figure 6A:
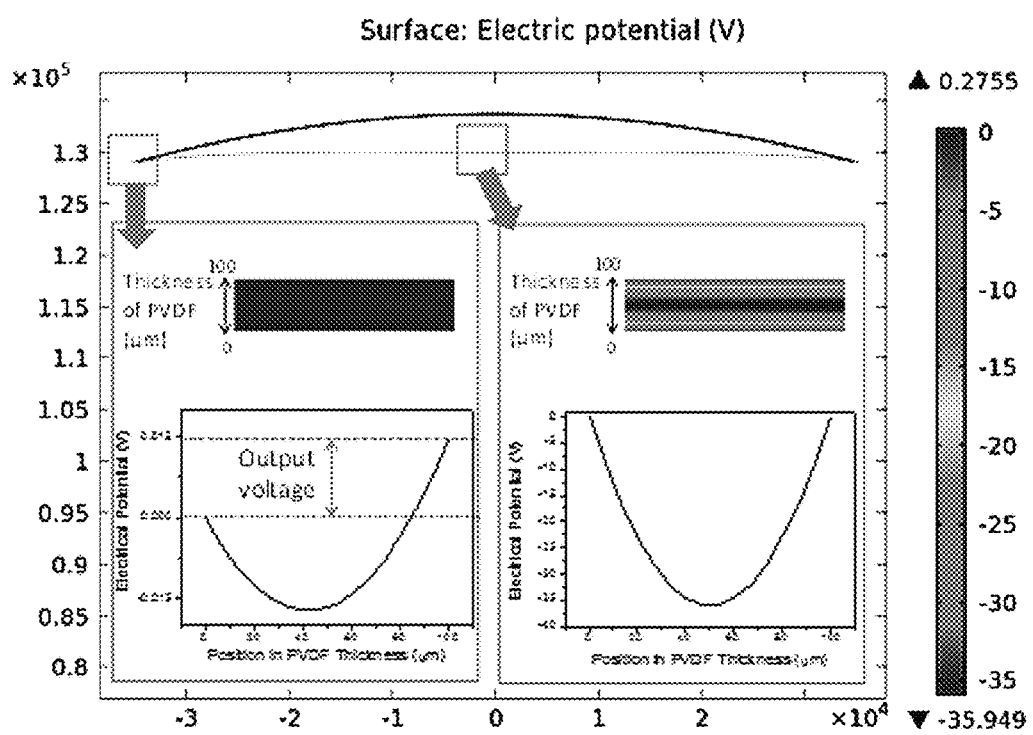
FIGS. 6A and 6B show an electrical potential of a piezoelectric material not applied to the curved substrate and a piezoelectric material applied onto the curved substrate.
Figure 6B:
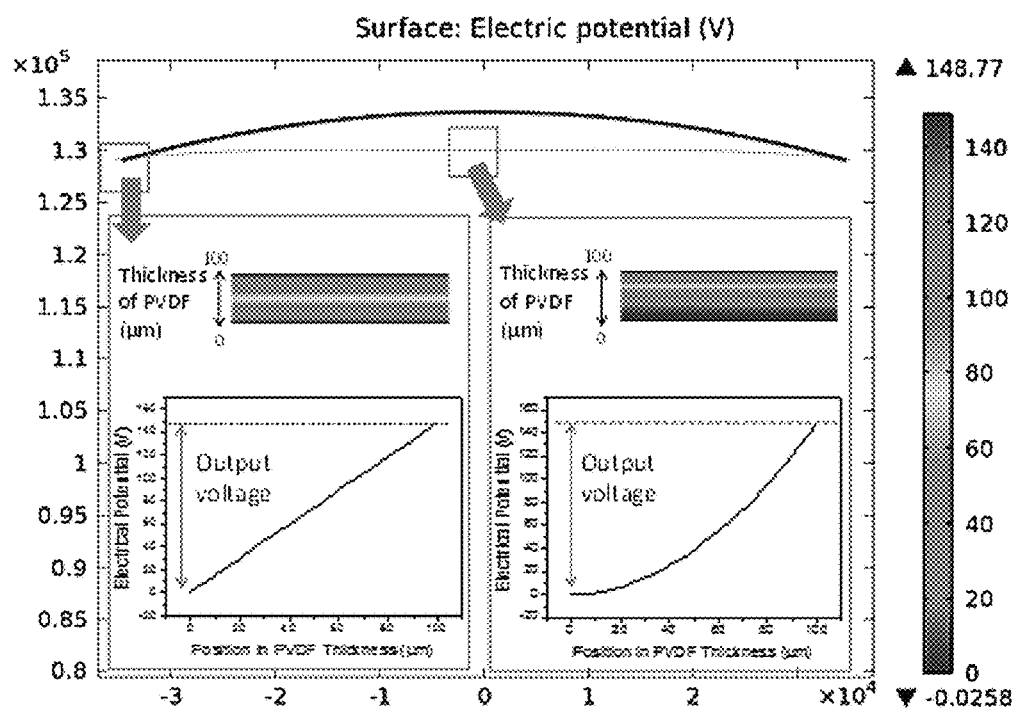

FIGS. 6A and 6B show an electrical potential of a piezoelectric material not applied to the curved substrate and a piezoelectric material applied onto the curved substrate. FIG. 6A shows an electrical potential of a piezoelectric material to which a curved substrate is not applied, FIG. 6B shows an electrical potential of a piezoelectric material applied onto a curved substrate. Also, in FIGS. 6A and 6B, a left graph shows an electrical potential at an end of the PVDF when a stress is applied, and a right graph shows an electrical potential at a center portion of the PVDF. In addition, the piezoelectric material applied on the curved substrate of FIGS. 6A and 6B is on the assumption that the neutral plane is designed to be present in the curved substrate.

Referring to FIGS. 6A and 6B, if a curved substrate is not applied, when a stress is applied, a compressive stress and a tensile stress simultaneously work to the piezoelectric material, and thus an electrical potential formed by the compressive stress and an electrical potential formed by the tensile stress are offset, thereby decreasing an electrical potential finally output. Meanwhile, if the piezoelectric material is applied onto a curved substrate, when a stress is applied and removed, only a compressive stress or a tensile stress works, and thus an electrical potential formed by the compressive stress and an electrical potential formed by the tensile stress are not offset, thereby exhibiting a maximum electrical potential.

Figure 7A:
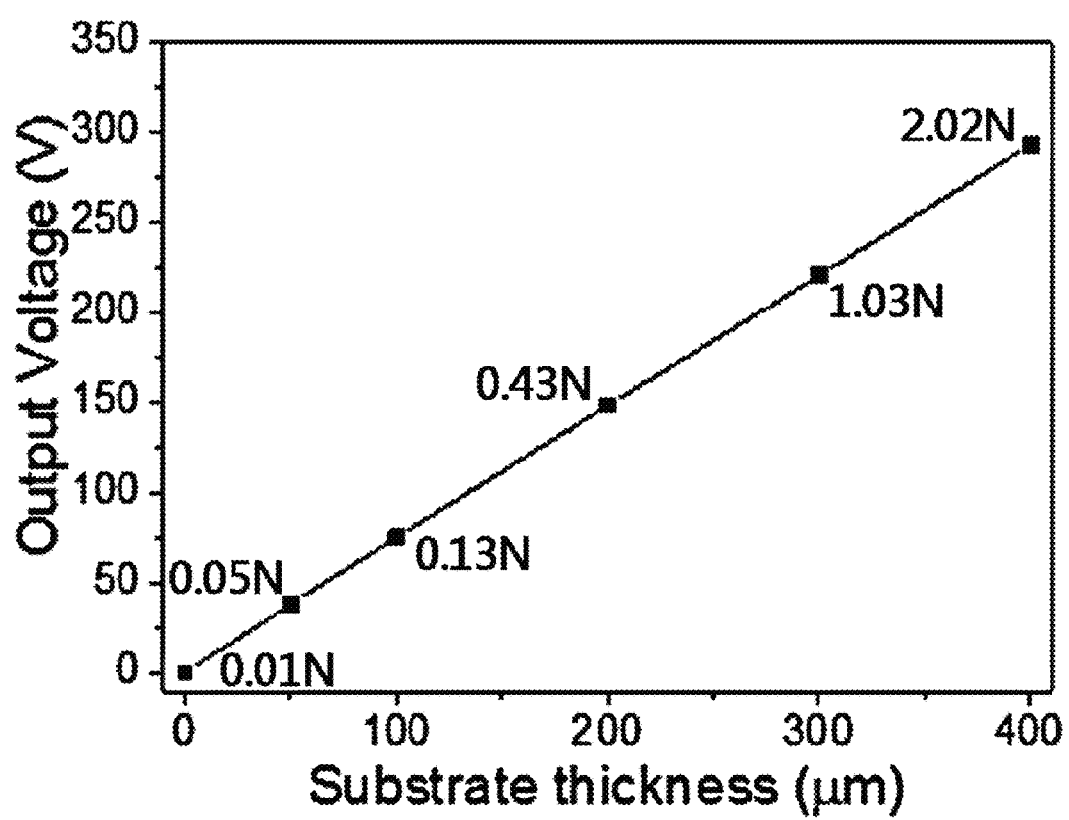
FIG. 7A shows a change of an output voltage according to a substrate thickness, on the assumption that a stress is applied so that a center portion of the curved piezoelectric device according to the present disclosure is deformed by 1 cm.
Figure 7B:
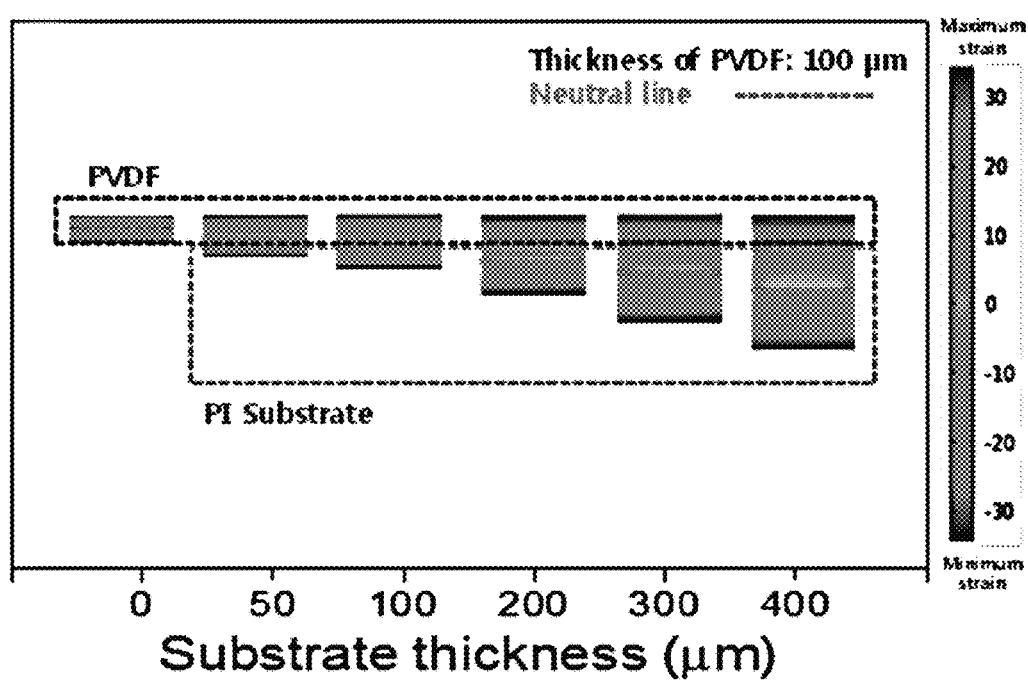
FIG. 7B shows a location change of the neutral plane according to a substrate thickness.

FIG. 7A shows a change of an output voltage according to a substrate thickness, on the assumption that a stress is applied so that a center portion of the curved piezoelectric device according to the present disclosure is deformed by 1 cm, and FIG. 7B shows a location change of the neutral plane according to a substrate thickness. Referring to FIG. 7A, if the substrate has a greater thickness, a stress increases for the deformation by 1 cm, and an output voltage of the piezoelectric material increases. Referring to FIG. 7B, if the substrate is thin, even though the neutral plane is present in the piezoelectric material (PVDF), as the thickness of the substrate increases, the neutral plane gradually moves toward the substrate.

Figure 8A:
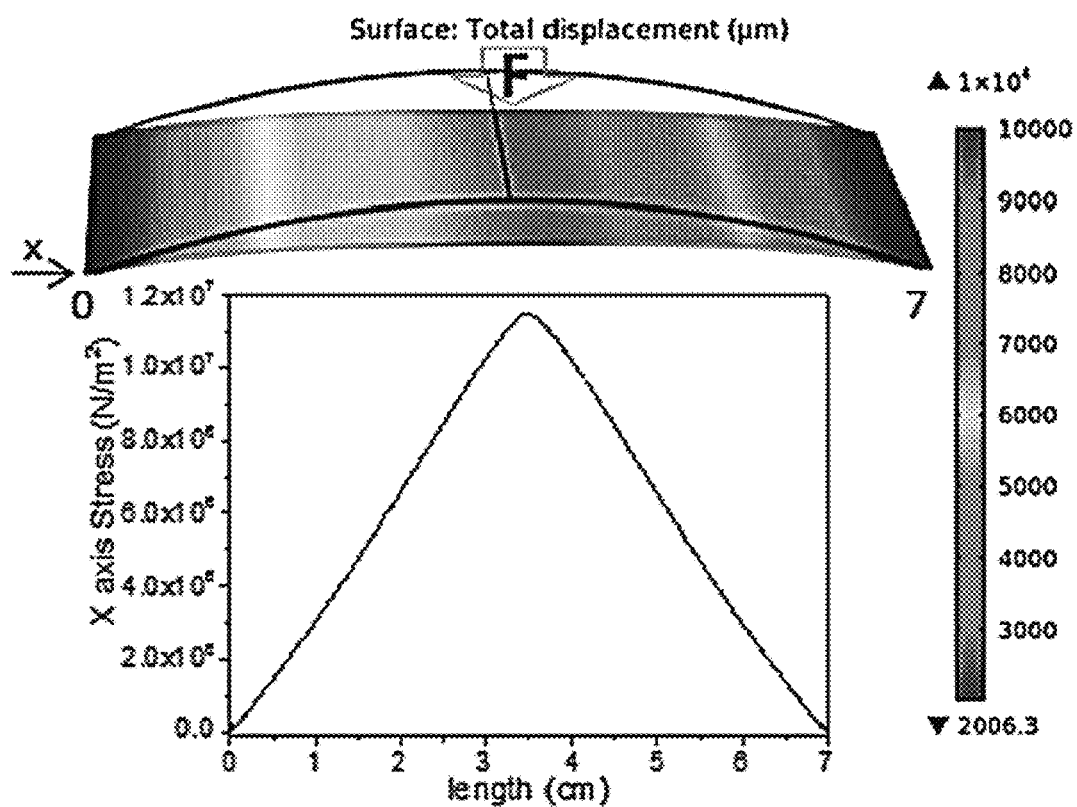
FIGS. 8A-8D show output voltage characteristics according to stress distribution characteristics and substrate thickness of the curved piezoelectric device according to the present disclosure and a piezoelectric device to which a planar substrate is applied.
Figure 8B:
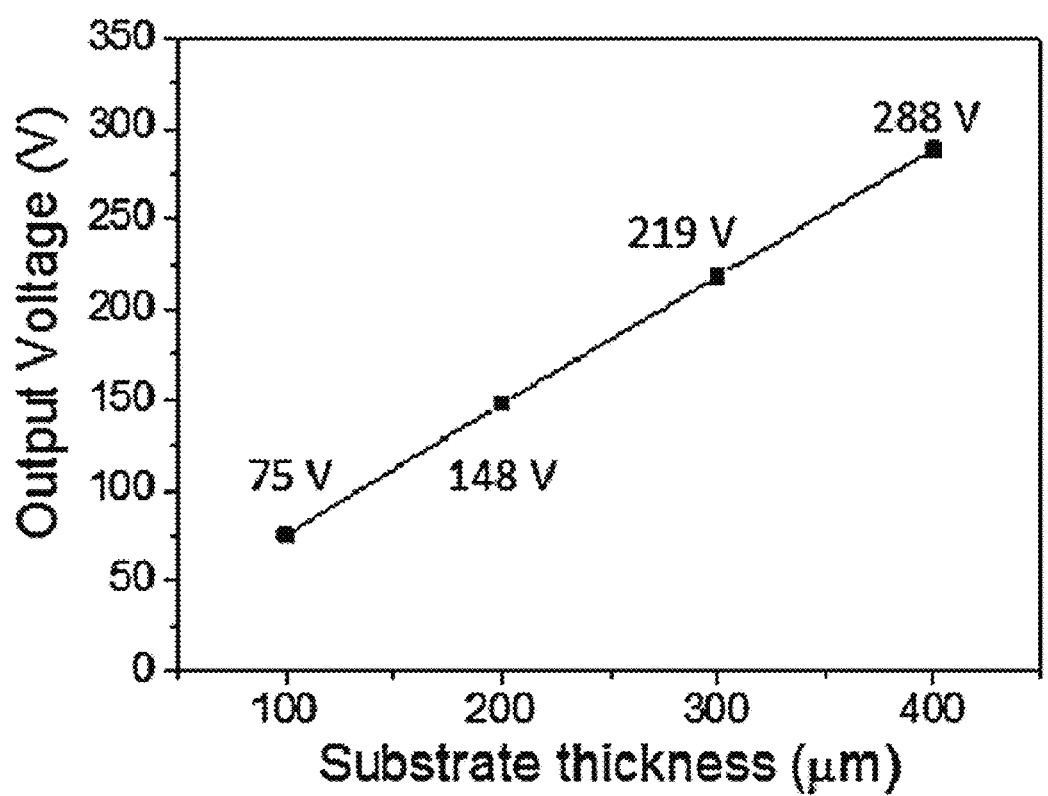
Figure 8C:
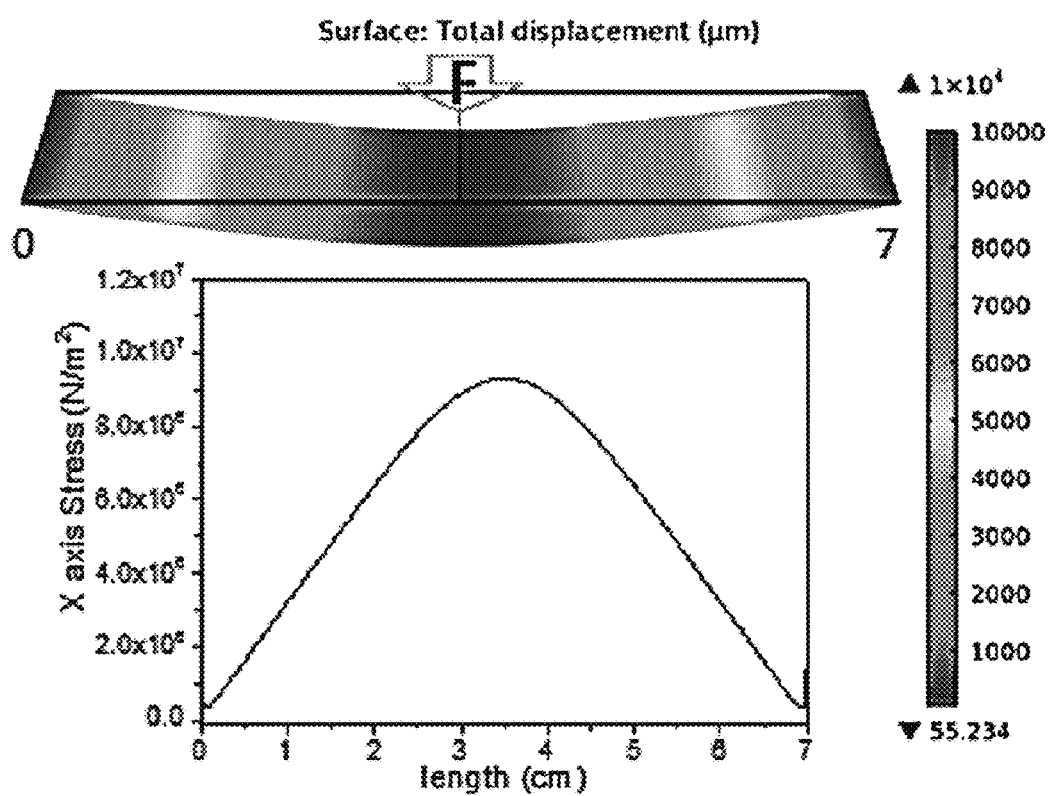
Figure 8D:
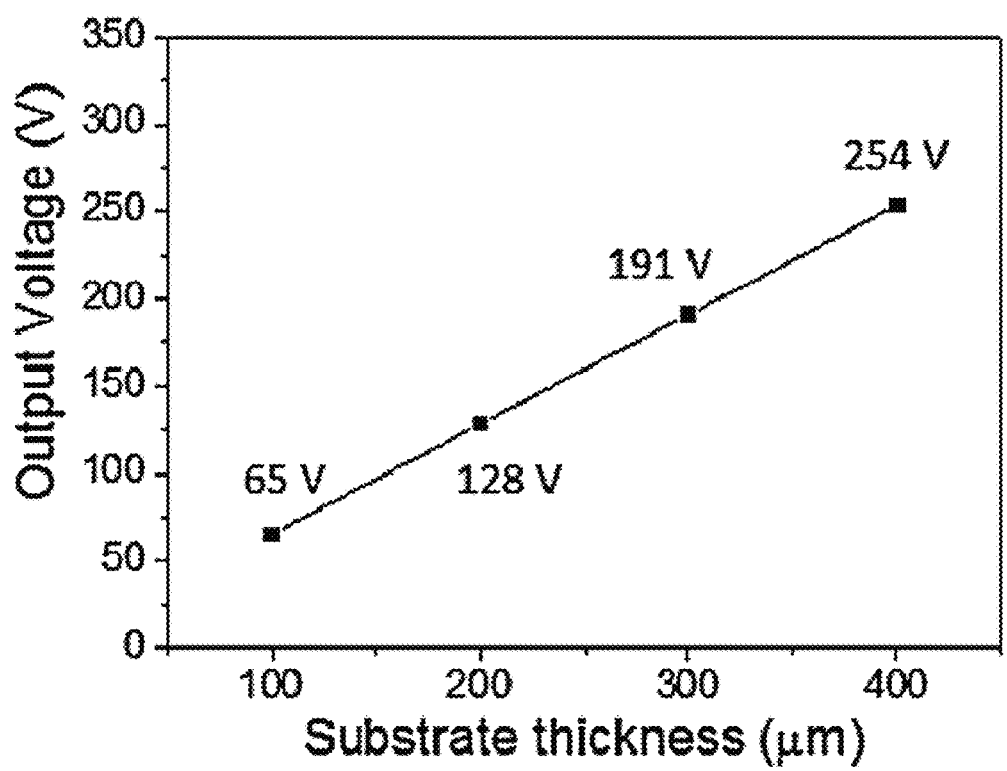

FIGS. 8A-8D show output voltage characteristics according to stress distribution characteristics and substrate thickness of the curved piezoelectric device according to the present disclosure (FIGS. 8A and 8B) and a piezoelectric device to which a planar substrate is applied (FIGS. 8C and 8D). Referring to FIG. 8A-8D, it may be found that in case of the planar piezoelectric device (see the FIG. 8C), even though a stress is applied to the center portion of the substrate, the stress is distributed to its peripherals, but in case of the curved piezoelectric device (see the FIG. 8A), if a stress is applied to the center portion of the substrate, the applied stress is concentrated on the center portion of the substrate, and thus strain is gradually distributed from one side of the piezoelectric material to other sides. If the intensity of stress working at both ends of the piezoelectric material is maximized, this means that the electrical potential of the piezoelectric material increases. This result may be found from the FIGS. 8B and 8D. Even though the same stress is applied, a greater stress may be applied to the curved piezoelectric device (see the FIG. 8B) in comparison to the planar piezoelectric device (see the FIG. 8D), thereby giving a great output voltage, and it may be found that even though the thickness of the substrate increases, this tendency is maintained.

What is claimed is:

1. A curved piezoelectric device, comprising:
a curved substrate; and
a piezoelectric material provided on one surface or both surfaces of the curved substrate,
wherein when a stress is applied, a neutral plane in which a compressive stress and a tensile stress are balanced is located in the curved substrate,
wherein the location of the neutral plane is determined by $y_1$ and $y_2$ of Equation 1 below, and
wherein the location of the neutral plane is controllable by adjusting a thickness (d) and a Young's modulus (E) of each of the curved substrate and the piezoelectric material:

$$y_1 = \frac{E_2 d_2 (d_1 + d_2)}{2(E_1 d_1 + E_2 d_2)}, \quad y_2 = \frac{E_1 d_1 (d_1 + d_2)}{2(E_1 d_1 + E_2 d_2)} \qquad \text{Equation 1}$$

where $y_1$ is a distance between a center line of the curved substrate and the neutral plane, $y_2$ is a distance between a center line of the piezoelectric material and the neutral plane, $d_1$ is a thickness of the curved substrate, $d_2$ is a thickness of the piezoelectric material, $E_1$ is a Young's modulus of the curved substrate, and $E_2$ is a Young's modulus of the piezoelectric material, with the proviso that $$y_2 > \frac{d_2}{2}.$$

2. A curved piezoelectric device, comprising:
a curved substrate; and
a piezoelectric material provided on one surface or both surfaces of the curved substrate,
wherein when a stress is applied, a neutral plane in which a compressive stress and a tensile stress are balanced is located in the curved substrate,
wherein the location of the neutral plane is determined by $y_1$ and $y_2$ of Equation 2 below, and
wherein the location of the neutral plane is controllable by adjusting a thickness (d), a sectional area (A) and a Young's modulus (E) of each of the curved substrate and the piezoelectric material:

$$y_1 = \frac{E_2 A_2 (A_1 + A_2)}{2(E_1 A_1 + E_2 A_2)}, \quad y_2 = \frac{E_1 A_1 (A_1 + A_2)}{2(E_1 A_1 + E_2 A_2)} \qquad \text{Equation 2}$$

where $y_1$ is a distance between a center line of the curved substrate and the neutral plane, $y_2$ is a distance between a center line of the piezoelectric material and the neutral plane, $d_2$ is a thickness of the piezoelectric material, $E_1$ is a Young's modulus of the curved substrate, $E_2$ is a Young's modulus of the piezoelectric material, $A_1$ is a sectional area of the curved substrate, and $A_2$ is a sectional area of the piezoelectric material, with the proviso that $$y_2 > \frac{d_2}{2}.$$

3. The curved piezoelectric device according to claim 1, wherein the piezoelectric material provided on one surface or both surfaces of the curved substrate is disposed in multiple layers.

4. The curved piezoelectric device according to claim 2, wherein the piezoelectric material provided on one surface or both surfaces of the curved substrate is disposed in multiple layers.

5. The curved piezoelectric device according to claim 1, wherein the curved substrate is made of a material allowing restoration by elasticity.

6. The curved piezoelectric device according to claim 2, wherein the curved substrate is made of a material allowing restoration by elasticity.

7. The curved piezoelectric device according to claim 1, wherein the curved substrate is a substrate made of polymer material or a substrate made of steel material with elasticity.

8. The curved piezoelectric device according to claim 2, wherein the curved substrate is a substrate made of polymer material or a substrate made of steel material with elasticity.

9. The curved piezoelectric device according to claim 1, wherein the piezoelectric material is any one of polymer-based piezoelectric material and inorganic piezoelectric material, or a composite material thereof.

10. The curved piezoelectric device according to claim 2, wherein the piezoelectric material is any one of polymer-based piezoelectric material and inorganic piezoelectric material, or a composite material thereof.

* * * * *